(12) United States Patent
Kainuma et al.

(10) Patent No.: US 8,008,193 B2
(45) Date of Patent: Aug. 30, 2011

(54) MANUFACTURING METHOD OF SEMICONDUCTOR DEVICE AND SEMICONDUCTOR MANUFACTURING APPARATUS THEREFOR

(75) Inventors: Yoshihiro Kainuma, Tokyo (JP); Tatsuhiko Miura, Tokyo (JP); Takashi Sato, Tokyo (JP); Katsuhiro Mitsui, Tokyo (JP); Daisuke Ono, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/436,158

(22) Filed: May 6, 2009

(65) Prior Publication Data

US 2010/0009532 A1 Jan. 14, 2010

(30) Foreign Application Priority Data

Jul. 8, 2008 (JP) .................................. 2008-177556

(51) Int. Cl.
*H01L 21/44* (2006.01)
*H01L 21/3205* (2006.01)

(52) U.S. Cl. ........ 438/652; 438/625; 438/650; 438/666; 257/664; 257/665; 257/734; 257/E23.079

(58) Field of Classification Search .......... 257/664–665, 257/734–786, E29.111–E29.165, E23.01–E23.079, 257/E23.141–E23.179; 438/650–666
See application file for complete search history.

(56) References Cited

U.S. PATENT DOCUMENTS

| 6,719,849 | B2 | 4/2004 | Horiguchi et al. |
| 2002/0036345 | A1* | 3/2002 | Iseki et al. .................... 257/734 |
| 2003/0034485 | A1* | 2/2003 | Uchida et al. .................... 257/4 |
| 2007/0173045 | A1* | 7/2007 | Matsumura et al. .......... 438/584 |

FOREIGN PATENT DOCUMENTS

| JP | 2001-332465 A | 11/2001 |
| JP | 2005-93886 A | 4/2005 |
| JP | 2005-136350 A | 5/2005 |

\* cited by examiner

*Primary Examiner* — N Drew Richards
*Assistant Examiner* — Mamadou Diallo
(74) *Attorney, Agent, or Firm* — Mattingly & Malur, PC

(57) ABSTRACT

Provided is a manufacturing method for improving the reliability of a semiconductor device having a back electrode. After formation of semiconductor elements on the surface of a silicon substrate, the backside surface thereof, which is opposite to the element formation surface, is subjected to the following steps in a processing apparatus. After deposition of a first metal film over the backside surface of the silicon substrate in a first chamber, it is heat treated to form a metal silicide film. Then, a nickel film is deposited in a third chamber, followed by deposition of an antioxidant conductor film in a second chamber. Heat treatment for alloying the first metal film and the silicon substrate is performed at least prior to the deposition of the nickel film. The first chamber has therefore a mechanism for depositing the first metal film and a lamp heating mechanism.

3 Claims, 10 Drawing Sheets

MANUFACTURING METHOD OF SEMICONDUCTOR DEVICE AND SEMICONDUCTOR MANUFACTURING APPARATUS THEREFOR

CROSS-REFERENCE TO RELATED APPLICATIONS

The disclosure of Japanese Patent Application No. 2008-177556 filed on Jul. 8, 2008 including the specification, drawings and abstract is incorporated herein by reference in its entirety.

BACKGROUND OF THE INVENTION

The present invention relates to a manufacturing technology of a semiconductor device, in particular, a technology effective when applied to a manufacturing method of a semiconductor device having a back electrode.

In the manufacturing steps of a semiconductor device, formation of various elements on a semiconductor material typified by single crystal silicon is performed while treating the semiconductor material in the form of a substantially planar circular thin plate called "semiconductor wafer". After formation of intended elements, the resulting semiconductor wafer is diced into equal semiconductor chips.

Elements formed on the semiconductor wafer include a MIS (Metal Insulator Semiconductor) type field effect transistor (also called "FET") (which will hereinafter be called "MIS transistor" simply) and a diode. A MIS transistor having a high withstand voltage and having a structure capable of treating high electric current is called "power MIS transistor".

Many elements typified by power MIS transistor and diode need a conductor film as an electrode on the backside surface of the semiconductor wafer opposite to the surface on which elements have been formed. The following are examples of the technology of forming a conductor film on the backside surface of a semiconductor wafer.

For example, Japanese Patent Laid-Open No. 2001-332465 (Patent Document No. 1) discloses a technology of forming a conductive film on an insulative pedestal on which a wafer to be treated is placed. The static electricity can be removed easily from the charged pedestal.

For example, Japanese Patent Laid-Open No. 2005-136350 (Patent Document 2) discloses a processing apparatus having a substrate-supporting susceptor and an electrostatic adsorption portion as an apparatus for applying various plasma treatments to an insulator substrate.

For example, Japanese patent Laid-Open No. 2005-93886 (Patent Document 3) discloses a technology of using, as a susceptor as described above, a susceptor made of quartz.
[Patent Document 1] Japanese Patent Laid-Open No. 2001-332465
[Patent Document 2] Japanese Patent Laid-Open No. 2005-136350
[Patent Document 3] Japanese Patent Laid-Open No. 2005-93886

SUMMARY OF THE INVENTION

The back electrode of such a semiconductor device investigated by the present inventors has a multilayer structure of conductor films having various functions. In particular, a metal silicide layer having good adhesion and low contact resistance is formed at the interface between the semiconductor wafer and the multilayer back electrode. The following is the formation process of this metal silicide layer investigated by the present inventors.

First, a metal film to be silicided is deposited over a semiconductor wafer made of single crystal silicon. Then, various conductor films having desired functions are deposited thereover. Finally, heat treatment is performed in a furnace to effect metal silicidation of the interface between the metal film and the semiconductor wafer. In such a manner, a metal silicide layer is formed at the interface.

As described above, in the manufacturing method studied by the present inventors, a metal silicide layer is formed by carrying out heat treatment after all the films including a metal film to be silicided at the interface with the semiconductor wafer are stacked. Such a method is employed in order to avoid atmospheric exposure during formation of a back electrode, thereby preventing oxidation of the surface of the metal film or other stacked films. This means that transport from a vacuum apparatus for depositing conductor films to a heat treatment furnace for silicidation should be performed after completion of the formation of all the conductor films. This makes it possible to actualize the formation of a back electrode with a low resistivity without forming a surface oxide film thereover during the deposition of conductor films.

As a result of further investigation on the manufacturing method of a semiconductor device including the formation step of a metal silicide layer as described above, the present inventors have found the following problem. Described specifically, heat treatment for silicidation causes a stress on a semiconductor wafer, because stacked conductor films made of various conductor materials differ from each other in a thermal expansion coefficient.

In particular, the stacked conductor films of the back electrode investigated by the present inventors include a conductor film made of nickel (Ni) in order to improve the adhesion with a solder to be used for the coupling to an outer flame or the like. Nickel has a function of alloying with a solder and use of it contributes to improvement in the adhesion between the solder and the back electrode. This nickel film has a thermal expansion coefficient largely different from that of the semiconductor wafer so that it imposes a large stress on the semiconductor wafer. When such a stress is imposed on the semiconductor wafer, it warps.

Warpage of the semiconductor wafer tends to cause adsorption due to contact with an unexpected portion or difficulty in housing of it in a cassette in subsequent steps. These problems may cause cracks or damage of the semiconductor wafer. As a result, they become a cause of deteriorating the reliability of the semiconductor device.

When the semiconductor wafer warps, on the other hand, this warpage may remain even after it is diced into semiconductor chips. Warpage of semiconductor chips tends to prevent satisfactory mounting to a flame or cause package cracks. As a result, it becomes a cause of deteriorating the reliability of the semiconductor device.

In particular, with a technological trend toward further miniaturization of elements formed on a semiconductor wafer and thinning of the semiconductor wafer in order to satisfy the request for the development of a semiconductor device having a higher performance, warpage of the semiconductor wafer due to stress becomes more prominent. It is therefore difficult to realize improvement in reliability in a high-performance semiconductor device by using the manufacturing method investigated by the present inventors.

Thus, further investigation by the present inventors has revealed that employment of the above manufacturing method of a semiconductor device including a formation step of a metal silicide layer investigated by the present inventors leads to deterioration in the reliability of the semiconductor device formed using the method.

An object of the present invention is therefore to provide a technology for improving the reliability of a semiconductor device having a back electrode.

The above and the other objects and novel features of the present invention will be apparent from the description herein and accompanying drawings.

Means for Solving the Problems

A plurality of inventions is disclosed herein. One example of them will hereinafter be summarized below.

In the invention, there is provided a manufacturing method of a semiconductor device, comprising the step of forming a semiconductor element over a first main surface of a semiconductor substrate and forming a conductor film over a second main surface opposite to the first main surface, wherein the step of forming a conductor film over a second main surface of the semiconductor substrate has a step of depositing a first metal film, heat treating the first metal film to alloy the interface between the first metal film and the semiconductor substrate, thereby forming a first conductor film, followed by deposition of a second conductor film having nickel as a principal component and a third conductor film having gold as a principal component. In particular, heat treatment for alloying the first metal film and the semiconductor substrate is performed prior to the deposition of the second conductor film and the above step for the second main surface is conducted in one processing apparatus with a view to preventing exposure of the semiconductor substrate to atmosphere.

ADVANTAGE OF THE INVENTION

An advantage available by the above example, among those available by the plural inventions disclosed herein, will hereinafter be described briefly as a typical one.

In short, the invention enables to improve the reliability of a semiconductor device having a back electrode.

DETAILED DESCRIPTION OF THE PREFERRED EMBODIMENTS

Figure 1:
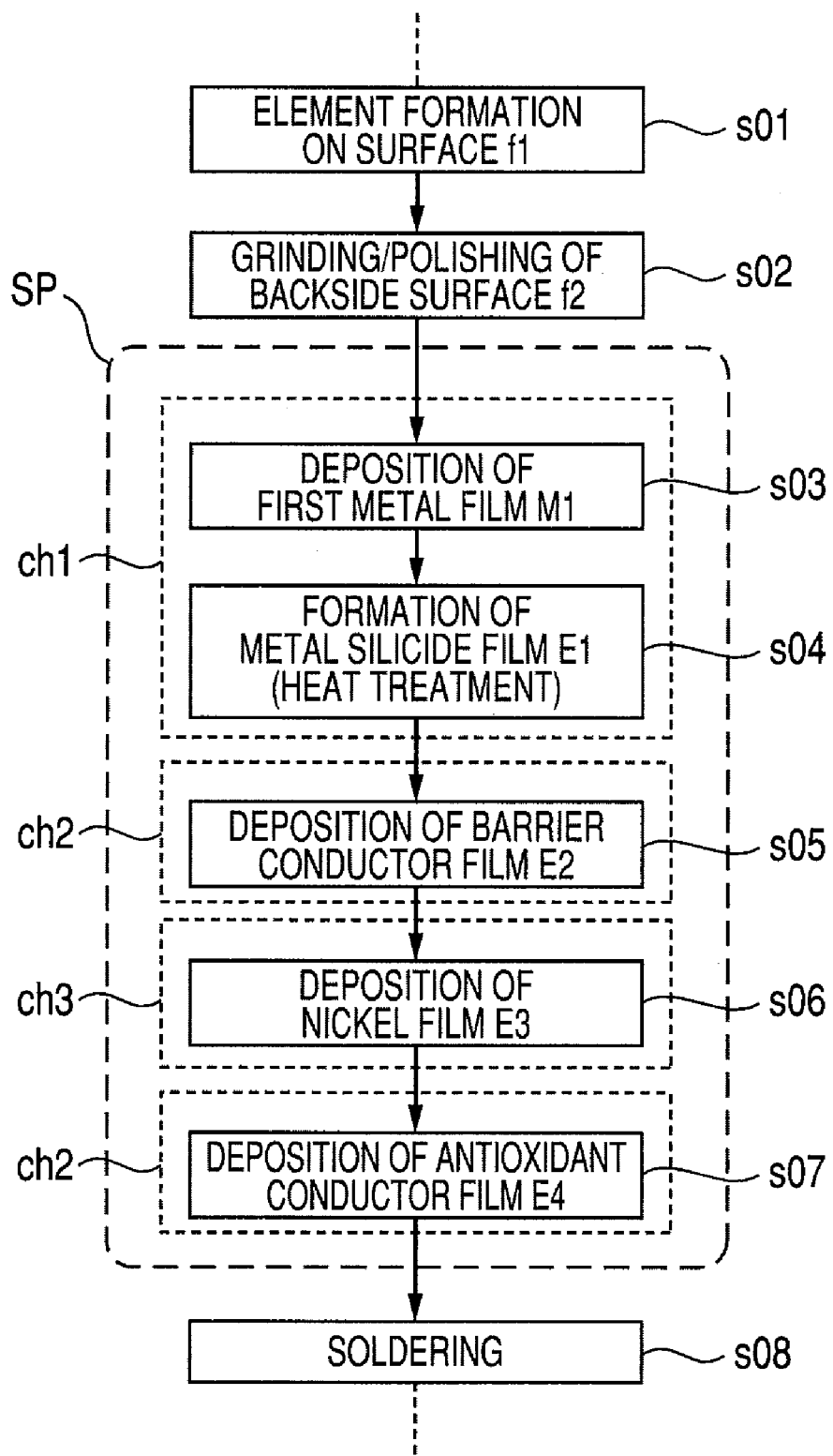
FIG. 1 is a flow chart illustrating manufacturing steps of a semiconductor device according to Embodiment 1.

In the following embodiments, a description will be made after divided in plural sections or in plural embodiments if necessary for convenience's sake. These plural sections or embodiments are not independent each other, but in a relation such that one is a modification example, details or complementary description of a part or whole of the other one unless otherwise specifically indicated. In the following embodiments, when a reference is made to the number of elements (including the number, value, amount, and range), the number is not limited to a specific number but can be greater than or less than the specific number unless otherwise specifically indicated or principally apparent that the number is limited to the specific number. Moreover, in the following embodiments, configuring elements (including elemental steps) are not always essential unless otherwise specifically indicated or principally apparent that the element is essential. Similarly, in the following embodiments, when a reference is made to the shape or positional relationship of the configuring elements, that substantially analogous or similar to it is also embraced unless otherwise specifically indicated or principally apparent that it is not. This also applies to the above-described value and range. In all the drawings for describing the embodiments, like members of a function will be identified by like reference numerals and overlapping descriptions will be omitted as much as possible. The embodiments of the invention will hereinafter be described specifically referring to drawings.

Figure 2:
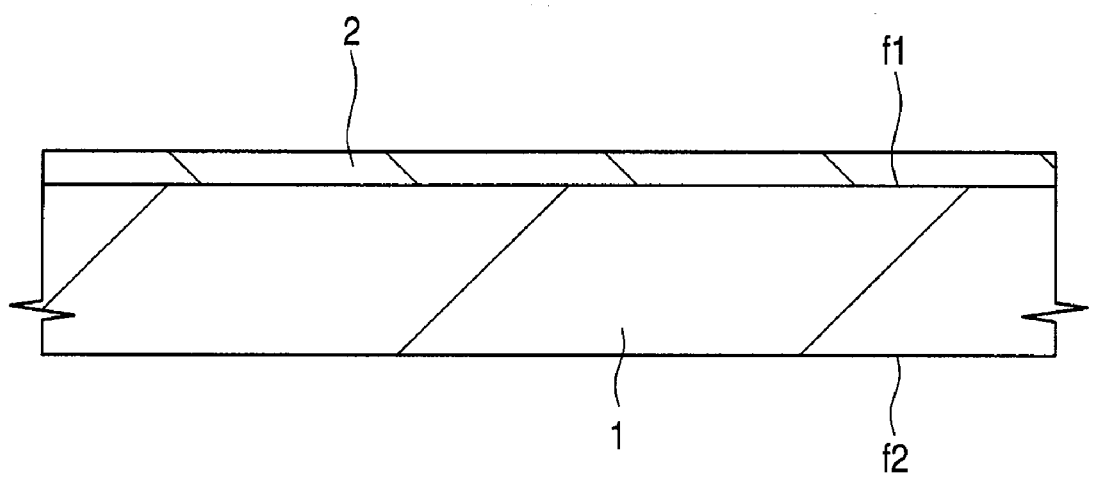
FIG. 2 is a fragmentary cross-sectional view during a manufacturing step of the semiconductor device according to Embodiment 1 of the invention.

(Embodiment 1) A manufacturing method of a semiconductor device according to Embodiment 1 will be described specifically referring to drawings. FIG. 1 is a flow chart showing the order of steps in the manufacturing method of a semiconductor device according to Embodiment 1. Drawings after FIG. 2 are fragmentary cross-sectional views in the manufacturing steps of the semiconductor device according to Embodiment 1 or schematic view of a manufacturing apparatus.

The manufacturing steps of the semiconductor device according to Embodiment 1 are applied to a silicon substrate 1 (semiconductor substrate) made of high-purity single crystal silicon. The silicon substrate 1 is a substantially planar circular thin plate (which will be called "semiconductor wafer") and has a surface (first main surface) f1 and a backside surface (second main surface) f2 opposite to each other along the thickness direction thereof. The manufacturing steps of the semiconductor device according to this Embodiment 1 start with the formation of desired semiconductor elements on the surface f1 of the silicon substrate 1 (Step s01 of FIG. 1). A layer having semiconductor elements and obtained by the step s01 is illustrated as a semiconductor element layer 2 in FIG. 2. The semiconductor element layer 2 includes a well for forming the elements, an isolation portion for defining element formation regions, various elements such as MIS transistor, diode, electrical resistor, and capacitor, and interconnect layers such as interlayer insulating film, contact plug, conductor interconnect, and via plug.

Figure 3:
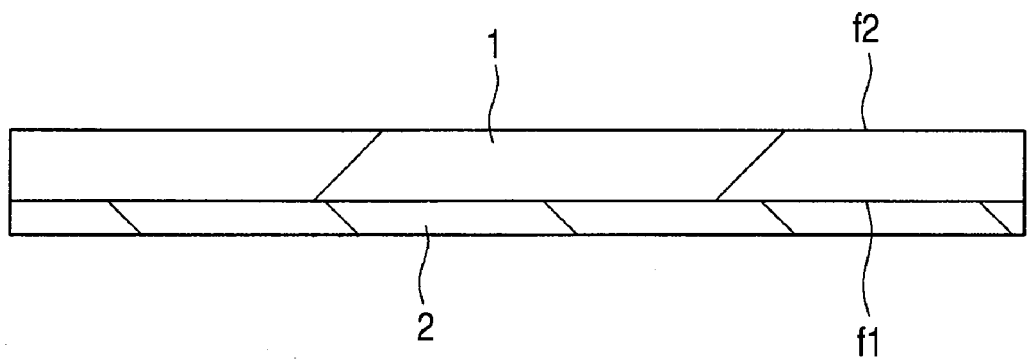
FIG. 3 is a fragmentary cross-sectional view of the semiconductor device during a manufacturing step subsequent to that of FIG. 2.

Then, as illustrated in FIG. 3, the backside surface f2 of the silicon substrate 1 is ground to thin the silicon substrate 1 (Step s02 of FIG. 1). Described specifically, the backside surface f2 is ground mechanically by using a grinder, for example, a so-called back grinder and then planarized by using mechanical chemical polishing (CMP).

In a step subsequent to the grinding, conductor films are deposited over the backside surface f2 of the silicon substrate 1 as a multilayer backside electrode. The deposition method will hereinafter be described specifically.

Figure 4:
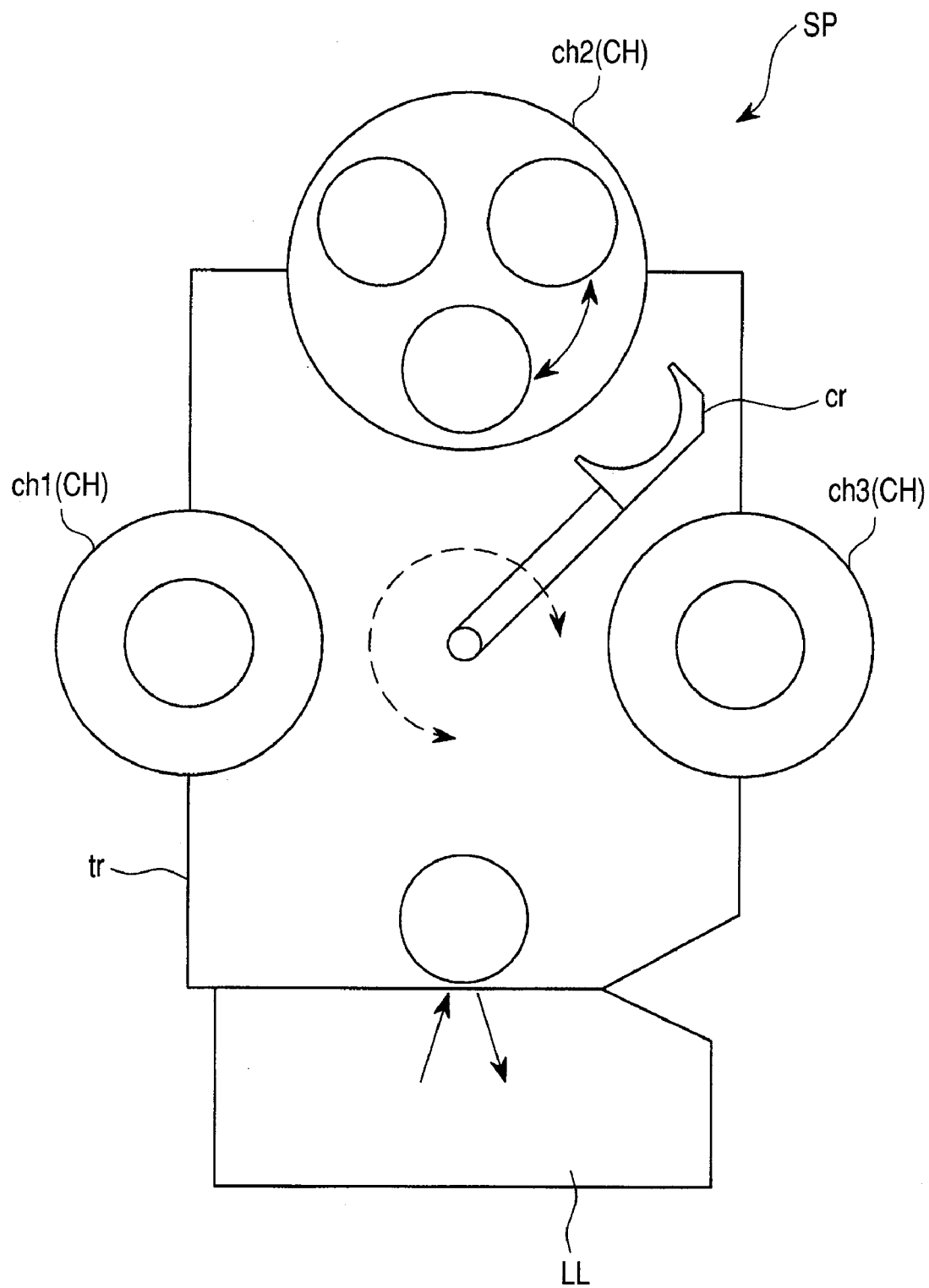
FIG. 4 is a schematic view of a semiconductor manufacturing apparatus according to Embodiment 1 of the invention.

The silicon substrate 1 is then put in a semiconductor manufacturing apparatus comprised of a processing apparatus SP as illustrated in FIG. 4 for depositing various conductor films over the backside surface f2 of the silicon substrate 1 which has been subjected to surface grinding and polishing. First, the configuration of the processing apparatus SP for forming thin films including various conductor films over the backside surface f2 of the silicon substrate 1 will be described specifically.

The processing apparatus SP of Embodiment 1 has a plurality of chambers (processing chambers) CH having a vacuum environment. The chambers CH each has an apparatus for creating, for each chamber, a vacuum environment such as vacuum pump. The chambers CH are equipped with a mechanism for carrying out sputtering or vacuum deposition for the silicon substrate 1. Various thin films are deposited over the silicon substrate 1 by using such a method.

The processing apparatus SP of Embodiment 1 has transfer chambers tr for coupling the plural chambers CH. The transfer chambers tr also have a vacuum apparatus independently from the plural the chambers CH so that the transfer chambers tr can have a vacuum environment.

The processing apparatus SP of Embodiment 1 has a robot arm (transport mechanism) cr for transporting the silicon substrate 1 in the processing apparatus SP. The practical transport mechanism of the silicon substrate 1 by using the robot arm will be described later specifically referring to FIGS. 5 to 7.

The processing apparatus SP of Embodiment 1 has a load lock chamber LL for taking the silicon substrate 1 out of the processing apparatus SP. The load lock chamber LL independently has a vacuum apparatus capable of creating a vacuum environment therefor. In particular, the load lock chamber LL can relatively quickly reduce the pressure therein to a pressure approximately equal to or slightly higher than that of the transfer chambers tr. The taking-in and taking-out of the silicon substrate 1 between the transfer chamber tr and the outside of the processing apparatus SP can be realized via this load lock chamber LL. Since the silicon substrate 1 is transported while reducing the pressure of the load lock chamber LL, the transfer chamber tr and the plural chambers CH are not exposed to the atmosphere even when the silicon substrate 1 is taken in or out from the processing apparatus SP.

A transport mechanism of the silicon substrate 1 in the processing apparatus SP according to Embodiment 1 will hereinafter be described specifically referring to FIGS. 5 to 7.

Figure 5:
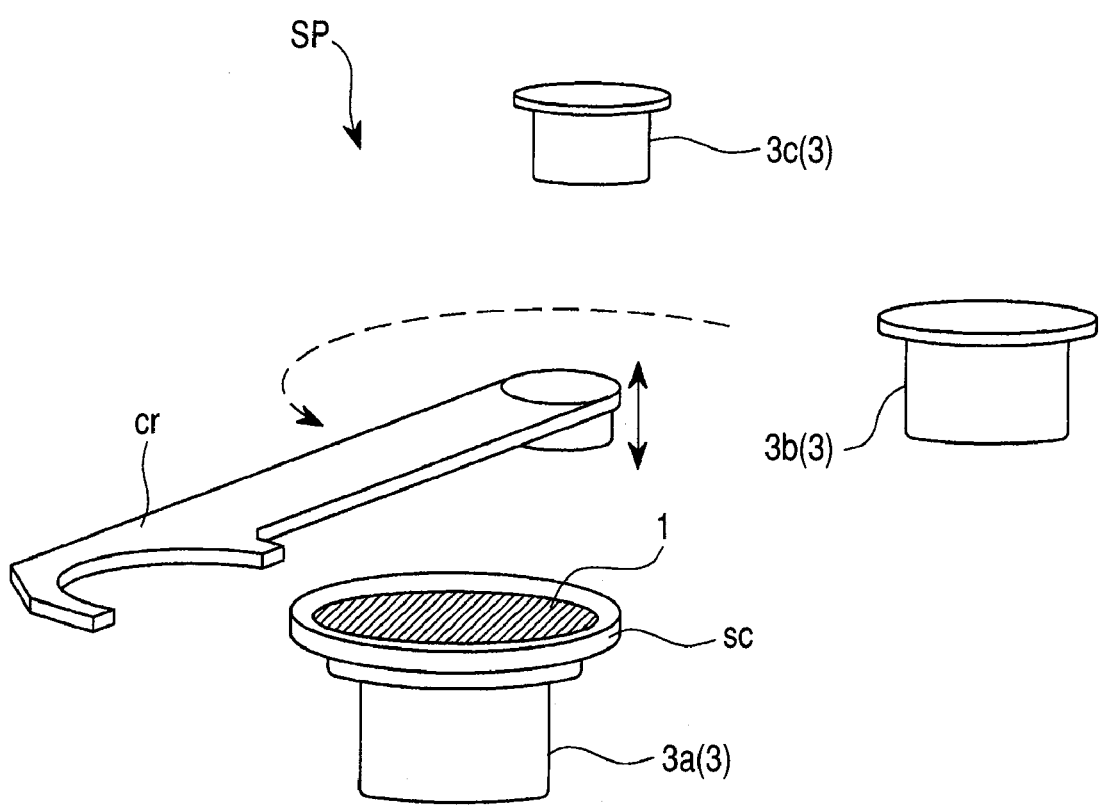
FIG. 5 is another schematic view of the semiconductor manufacturing apparatus according to Embodiment 1 of the invention.

As illustrated in FIG. 5, the silicon substrate 1 is supported by a susceptor (support) sc in the processing apparatus SP. The susceptor sc is a frame-like member having an inner diameter smaller than the diameter of the silicon substrate 1 in wafer form and an outer diameter greater than the diameter of the silicon substrate and it supports the silicon substrate 1 in wafer form by holding the outer periphery of the silicon substrate 1.

The robot arm cr has a function of transporting the silicon substrate 1 by moving the susceptor sc in which the silicon substrate 1 is supported. In such a manner, the silicon substrate 1 is transported from a susceptor pedestal 3a to another susceptor pedestal 3b or 3c via the robot arm cr. The susceptor pedestal 3 is installed in the plural chambers CH, the load lock chamber LL, or the transfer chamber tr to place thereon the silicon substrate 1 supported by the susceptor sc. The robot arm cr can therefore move and rotate within the same plane as each susceptor pedestal 3. In addition, the robot arm cr can move vertically so as to place the susceptor sc on the susceptor pedestal 3 or separate it from the susceptor pedestal 3. The transporting step via the robot arm cr will next be described specifically.

Figure 6:
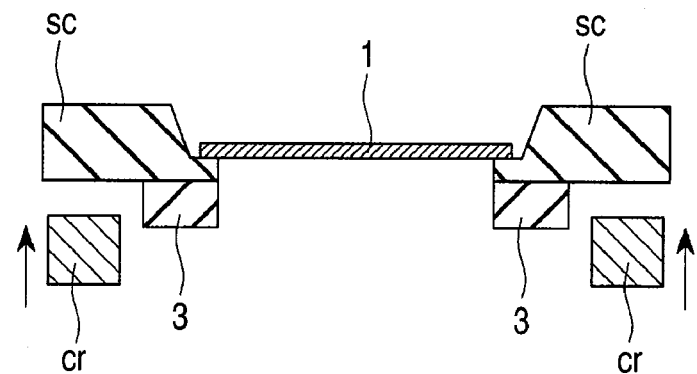
FIG. 6 is a fragmentary cross-sectional view illustrating a manufacturing step, subsequent to that of FIG. 3, of a semiconductor device by using the semiconductor manufacturing apparatus of Embodiment 1 of the invention.
Figure 7:
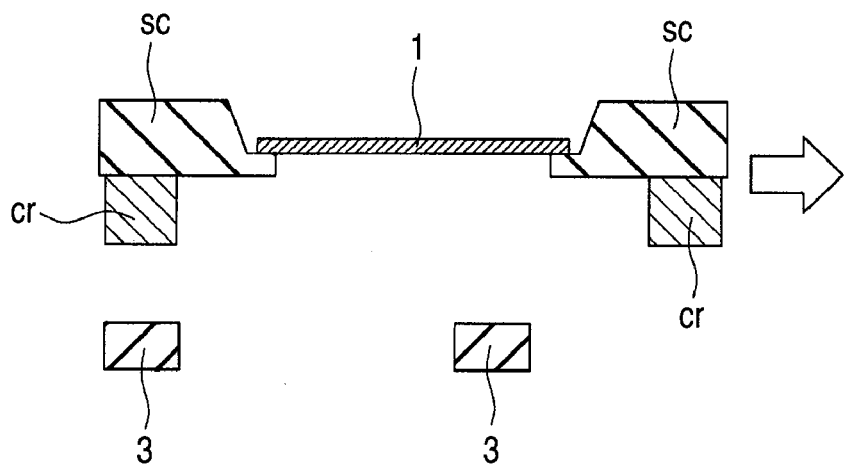
FIG. 7 is a fragmentary cross-sectional view in a manufacturing step of the semiconductor device subsequent to that of FIG. 6.

FIGS. 6 and 7 are each a fragmentary cross-sectional view illustrating the silicon substrate 1 supported by the susceptor sc during the transporting step using the robot arm.

As illustrated in FIG. 6, the silicon substrate 1 supported by the susceptor sc is placed on the susceptor pedestal 3. The susceptor sc has a portion having a greater diameter than that of the susceptor pedestal 3. With the silicon substrate 1 supported by the susceptor sc, the robot arm cr lifts up the susceptor sc and separates it from the susceptor pedestal 3. Then, as illustrated in FIG. 7, the robot arm cr moves in a direction away from the susceptor pedestal 3 and transports the silicon substrate 1 supported by the susceptor sc. The silicon substrate 1 supported by the susceptor sc is charged in the load lock chamber LL of the processing apparatus SP illustrated in FIG. 4 and is then transported among the plural chambers CH and the transfer chamber tr by the above mechanism.

As described above, the processing apparatus SP of Embodiment 1 is equipped with the transfer chamber tr and the robot arm cr so that it has a function of transporting the silicon substrate 1 among the plural chambers CH without exposing it to the atmosphere.

In the manufacturing method of Embodiment 1, the silicon substrate 1 whose backside surface f2 has been ground and polished (Step s02 of FIG. 1) by the step of FIG. 3 is transferred to a first chamber (first processing chamber) ch1, one of the chambers CH in the processing apparatus SP of FIG. 4, by the above transfer mechanism.

Figure 8:
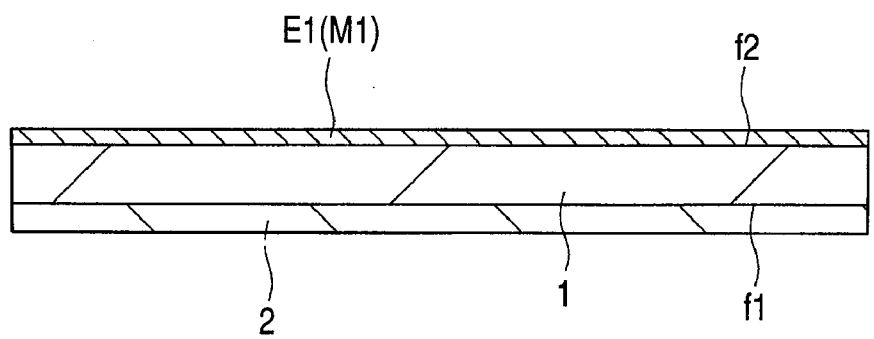
FIG. 8 is a fragmentary cross-sectional view in a manufacturing step of the semiconductor device subsequent to that of FIG. 7.

In the next step, a first metal film M1 is deposited over the backside surface f2 of the silicon substrate 1 in the first chamber ch1 as illustrated in FIG. 8 (Step s03 of FIG. 1). The silicon substrate 1 is then heat treated. Since an alloying (silicidation) reaction occurs at a portion where silicon and the first metal film M1 are brought into contact with each other, a metal silicide film (first conductor film) E1 can be formed at the interface between the first metal film M1 and the backside surface f2 of the silicon substrate 1 (Step s04 of FIG. 1).

The metal silicide film E1 is formed with a view to improving the adhesion between the silicon substrate 1 and the back electrode made of stacked conductor films which will be formed later over the metal silicide film and reducing their connection resistance. As the metal silicide film E1 capable of satisfying such purposes, a conductor film having a nickel silicide film or a gold silicide film as a principal component is used. In this case, in Step s03 of FIG. 1, a metal film having nickel or gold as a principal component is deposited as the first metal film M1.

The semiconductor manufacturing apparatus of Embodiment 1 has a configuration as described below in order to actualize the above formation step of the metal silicide film E1. Described specifically, the first chamber ch1 of the processing apparatus SP has the following configuration to heat-treat the first metal film M1 in the first chamber ch1 immediately after deposition of it to obtain the metal silicide film E1.

The first chamber ch1 of Embodiment 1 has a mechanism of depositing the first metal film M1 having nickel or gold as a principal component over the backside surface f2 (or the surface f1) of the silicon substrate 1 by sputtering. Further, the first chamber ch1 of Embodiment 1 is equipped with a heating mechanism for heating the silicon substrate 1 in the chamber. The heating mechanism of the first chamber ch1 of Embodiment 1 will be described specifically referring to FIG. 9.

Figure 9:
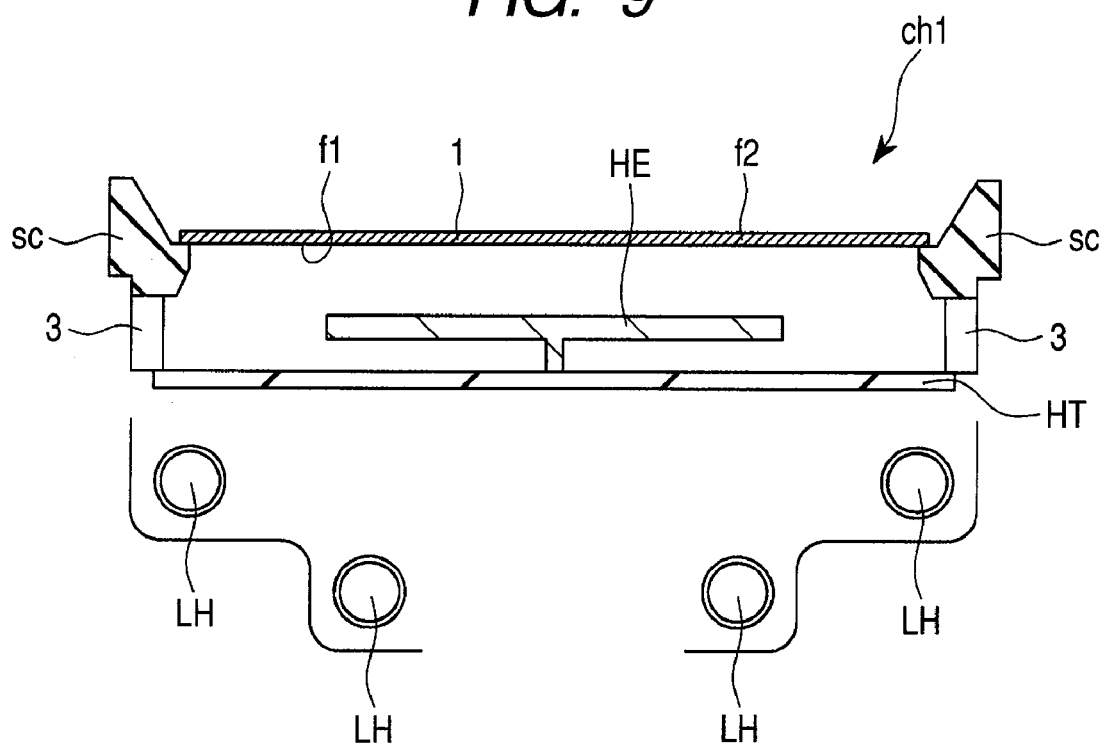
FIG. 9 is a fragmentary cross-sectional view illustrating a manufacturing step, subsequent to that of FIG. 8, of a semiconductor device by using the semiconductor manufacturing apparatus of Embodiment 1 of the invention.

As illustrated in FIG. 9, the silicon substrate 1 supported by the susceptor sc is placed on the susceptor pedestal 3 in the first chamber ch1. At this time, the silicon substrate 1 is placed on the susceptor sc and susceptor pedestal 3 so that the backside surface f2 of the silicon substrate 1 faces the deposition side of the first metal film M1 by sputtering. The first chamber ch1 is equipped with a lamp heater (lamp heating mechanism) LH. The lamp heater LH is placed below the silicon substrate 1 to enable heating of the silicon substrate 1. The term "below the silicon substrate 1" means a side (the surface f1 side of the silicon substrate 1) opposite to the side on which the first metal film M1 is deposited by sputtering. The lamp heater LH is in loop form. The lamp heater LH in loop form is placed so that the circumference of it follows the shape of the silicon substrate 1 supported by the susceptor sc. The lamp heater LH may be in a multiple loop form. FIG. 9 illustrates the lamp heater LH in double loop form as one example of the loop heater.

With the lamp heater LH as described above, the silicon substrate 1 can be heated in the same first chamber ch1 in which the first metal film M1 is deposited over the silicon substrate 1. Accordingly, in Embodiment 1, the metal silicide film E1 can be formed by, immediately after deposition of the first metal film M1 on the backside surface f2 of the silicon substrate 1, heat treating the silicon substrate 1 with the lamp heater LH to alloy the interface between the first metal film M1 and the silicon substrate 1.

In the first chamber ch1 of Embodiment 1, a thermo-equalizing plate HE is placed so as to lie between the silicon substrate 1 and the lamp heater LH, supposing that the silicon substrate 1 is supported by the susceptor sc. This thermo-equalizing plate HE is a substantially planar circular thin plate similar to the silicon substrate 1 but has a diameter smaller than that of the silicon substrate 1. In addition, it is placed so as to be coaxial with the silicon substrate 1.

When the silicon substrate 1 is heated using the lamp heater LH of Embodiment 1, the temperature at the center portion of the silicon substrate 1 becomes the highest because the lamp heater LH is in loop form. The thermo-equalizing plate HE as described above serves to block a radiation heat focused on the center of the silicon substrate 1 in wafer form and suppress a temperature rise. Even by the heat treatment with the lamp heater LH, an in-plane temperature rise of the silicon substrate 1 can be made more uniform.

The thermo-equalizing plate HE used for the above purpose is preferably made of a material capable of preventing transmission of infrared rays and having a high melting point. Examples include high-melting-point materials such as tantalum (Ta), molybdenum (Mo), and tungsten (W) and ceramics materials such as alumina and silicon carbide.

The first chamber of Embodiment 1 has therein a semi-transparent plate HT such as that placed between the thermo-equalizing plate HE and the lamp heater LH. The semi-transparent HT is made of a frosted glass and is used for preventing the silicon substrate 1 from being exposed directly to radiation heat from the lamp heater LH. This enables to prevent a drastic temperature rise of the silicon substrate 1 and facilitates temperature control.

More specifically, the steps (Steps s03 and s04 of FIG. 1) are performed as described below by using the mechanism of the first chamber ch1. As one example, a first metal film M1 of about 50 nm thick is deposited over the backside surface f2 of the silicon substrate 1 by sputtering. Then, the resulting substrate is heated at about 350° C. for about 60 seconds by the lamp heater LH, whereby the metal silicide film E1 is formed over the backside surface f2 of the silicon substrate 1. All of the above operations are performed in the first chamber ch1.

Figure 10:
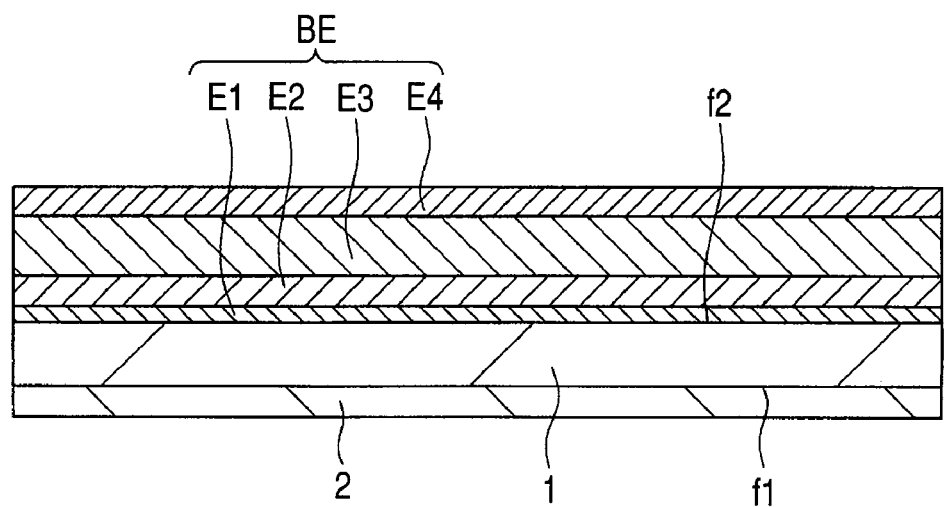
FIG. 10 is a fragmentary cross-sectional view in a manufacturing step of the semiconductor device subsequent to that of FIG. 9.

In the next step, as illustrated in FIG. 10, a barrier conductor film (fourth conductor film) E2 is deposited so as to cover therewith the metal silicide film E1 over the backside surface f2 of the silicon substrate 1 (Step s05 of FIG. 1). Then, a nickel film (second conductor film) E3 is deposited so as to cover therewith the metal silicide film E1 via the barrier conductor film E2 over the backside surface f2 of the silicon substrate 1 (Step s06 of FIG. 1). Then, in a similar manner, an antioxidant conductor film (third conductor film) E4 is deposited (Step s07 of FIG. 1). In such a manner, the back electrode BE made of a conductor film stack having the metal silicide film E1, the barrier conductor film E2, the nickel film E3, and the antioxidant conductor film E4 is formed over the backside surface f2 of the silicon substrate 1.

The role of each of these layers will next be described, followed by the description of a specific deposition method thereof.

The barrier conductor film E2 of Embodiment 1 has titanium or tungsten, or a compound thereof as a principal component. Such a barrier conductor film E2 has a function of preventing diffusion and penetration of easily diffusible metal atoms from the upper layer into the silicon substrate 1. For example, the antioxidant conductor film, which will be described later, contains relatively diffusible gold. When gold atoms reach the silicon substrate, they change electrical properties thereof. The barrier conductor film E2 is deposited so as to prevent easily diffusible atoms such as gold atoms from reaching the silicon substrate 1.

The nickel film E3 of Embodiment 1 is a conductor 22 film having nickel as a principal component. This nickel film E3 has a function of alloying with tin (Sn), which is a component of a solder, and enhancing adhesion when the silicon substrate 1 is soldered to an outer flame or the like.

The antioxidant conductor film E4 of Embodiment 1 is a conductor film having gold as a principal component. Such an antioxidant conductor film E4 is relatively inert to natural oxidation. As will be described later, after formation of the back electrode BE over the backside surface f2 of the silicon substrate 1 by the present step, the silicon substrate 1 is taken out of the processing apparatus SP of Embodiment 1 for the next step. In other words; after formation of the back electrode BE, the silicon substrate 1 is exposed to the atmosphere. The antioxidant conductor film E4 made of a conductor film having gold as a principal component and resistant to natural oxidation is therefore deposited over the uppermost surface of the back electrode BE.

The formation method of each of these conductor films and configuration of the manufacturing apparatus for actualizing it will next be described.

First, the barrier conductor film E2 is deposited in a second chamber (second processing chamber) ch2 (refer to FIG. 4), which is one of the chambers CH (Step s05 of FIG. 1). The second chamber ch2 is equipped with a mechanism of depositing a conductor film having as a principal component titanium or tungsten, or a compound thereof over the backside surface f2 of the silicon substrate 1 by sputtering. In particular, the second chamber ch2 is equipped with a mechanism capable of depositing materials other than those described above by sputtering. In other words, the second chamber ch2 of Embodiment 1 is equipped with a mechanism of depositing a plurality of thin films over the main surface (the surface f1 or the backside surface f2) of the silicon substrate 1. In the present step, as one example, the above barrier conductor film E2 is deposited over the backside surface f2 of the silicon substrate 1 to give a thickness of about 100 nm.

Then, the nickel film E3 is deposited in a third chamber (third processing chamber) ch3 (refer to FIG. 4) which is one of the chambers CH (Step s06 of FIG. 1). The third chamber ch3 has a mechanism of depositing a second conductor film having nickel as a principal component over the main surface (the surface f1 or the backside surface f2) of the silicon substrate 1 by sputtering. In the present step, the nickel film E2 is deposited over the backside surface f2 of the silicon substrate 1 to give a thickness of from 200 to 400 nm.

Next, the antioxidant conductor film E4 is deposited in the second chamber ch2 in which the barrier conductor film E2 has been deposited (Step s07 of FIG. 1). The second chamber ch2 is therefore equipped with a mechanism of depositing, in addition to a conductor film having titanium or tungsten as a main component, a conductor film having gold as a principal component by sputtering. In the present step, the antioxidant conductor film E4 is deposited over the backside surface f2 of the silicon substrate 1 to give a thickness of about 100 nm.

As described above, in the manufacturing method of Embodiment 1, the back electrode BE made of the metal silicide film E1, the barrier conductor film E2, the nickel film E3, and the antioxidant conductor film E4 is formed over the backside surface f2 of the silicon substrate 1 by using the processing apparatus SP of Embodiment 1 having the plural chambers CH. This step of forming the back electrode BE is performed in the processing apparatus SP under the same vacuum environment without exposing the silicon substrate 1 to the atmosphere during the formation step. In particular, according to the manufacturing method of the semiconductor device in Embodiment 1, heat treatment (Step s04 of FIG. 1) for forming the metal silicide film E1 by the silicidation of the first metal film M1 is performed immediately after the formation of the first metal film M1 but prior to the formation of the barrier conductor film E2 rightly on the first metal film M1. Advantages brought by the formation of the back electrode BE in accordance with the manufacturing method of Embodiment 1 will be described later in detail.

Figure 11:
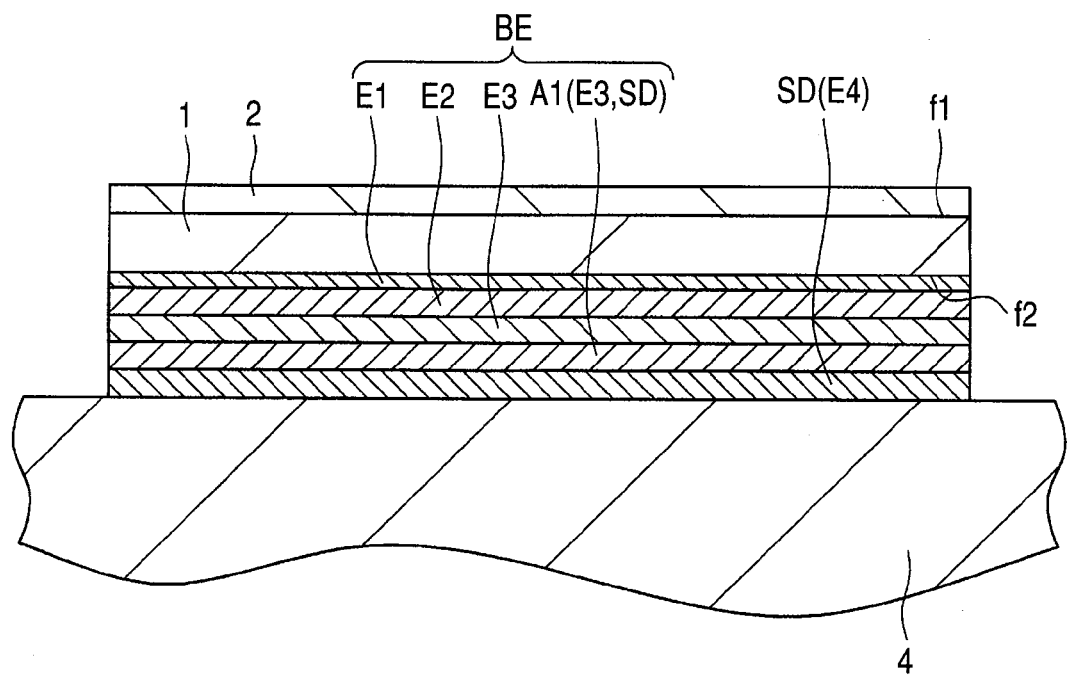
FIG. 11 is a fragmentary cross-sectional view in a manufacturing step of the semiconductor device subsequent to that of FIG. 10.

The silicon substrate 1 is then taken out from the processing apparatus SP, followed by steps subsequent thereto. In the subsequent steps, as illustrated in FIG. 11, the back electrode BE of the silicon substrate 1 and a frame 4 are soldered with a solder SD having tin as a component (Step s08 of FIG. 1). More specifically, the back electrode BE and the flame 4 are opposed and brought into contact with each other with the solder SD inserted therebetween and heated at a melting point of the solder SD or greater (similar to the ordinary soldering step). The back electrode BE and the flame 4 are thus electrically coupled to each other. Such a flame 4 is a current supplying member from the outside via the back electrode BE in order to apply a voltage to the semiconductor element 1 layer 2 formed over the silicon substrate 1 and is made of, for example, a conductor having copper (Cu) as a principal component.

When the back electrode BE having a composition as described above referring to FIG. 10 is soldered to the flame 4, the uppermost-surface antioxidant conductor film E4 having gold as a component thereof diffuses in the solder SD to cause contact between the solder SD and the nickel film E3. Tin configuring the solder SD and the nickel film E3 are alloyed to form a nickel-tin alloy film Al. The nickel-tin alloy film Al formed in such a manner contributes to improvement in the adhesion between the back electrode BE and the solder SD and reduction of the contact resistance.

As described above, the manufacturing method of the semiconductor device according to Embodiment 1 has a step of forming the back electrode BE over the backside surface f2 of the silicon substrate 1 by using the semiconductor manufacturing apparatus comprised of the processing apparatus SP of Embodiment 1. Effects and advantages of this method will hereinafter be described in detail.

The back electrode BE of Embodiment 1 contains the nickel film E. As described above, this is a necessary configuration for electrical coupling with the solder SD. According to the investigation by the present inventors, a difference in thermal expansion coefficient between the nickel film E3 and the silicon substrate 1 is particularly large compared with that between the silicon substrate 1 and the other layer configuring the back electrode BE. Heat treatment after deposition of the nickel film E3 over the silicon substrate 1 therefore imposes a stress on the silicon substrate 1.

According to the investigation by the present inventors, upon formation of the back electrode from a conductor film stack, a manufacturing method different from stacked in the same vacuum environment by sputtering or the like and then, heat treating the film stack in another manufacturing apparatus such as furnace to form a metal silicide layer at the interface between the film stack and the silicon substrate. At the time of heat treatment in the above method, since a conductor film made of nickel is formed over the silicon substrate as a constituent of the back electrode, it imposes a stress on the silicon substrate and becomes a cause of warpage. In order to carry out heat treatment for forming the metal silicide layer prior to the deposition of the nickel film, the silicon substrate should be exposed to the atmosphere once and transferred to the furnace so that the above method is not appropriate from the viewpoint of surface oxidation.

In the processing apparatus SP of Embodiment 1, on the other hand, the first chamber ch1 for depositing the first metal film M1 by sputtering is equipped with a lamp heater LH. This makes it possible to carry out heat treatment immediately after the deposition of the first metal film M1 over the backside surface f2 of the silicon substrate 1 to form the metal silicide film E1. According to the manufacturing method of Embodiment 1, the back electrode BE can be formed without heat treating the nickel film E3 and at the same time, without exposing the silicon substrate 1 to the atmosphere. In other words, warpage of the silicon substrate 1 due to the stress of the nickel film E3 can be reduced. This leads to reduction of cracks or damage of the silicon substrate 1 during the manufacturing steps or reduction of unsatisfactory mounting of a chip or generation of package cracks. As a result, reliability of a semiconductor device having a back electrode can be improved.

According to the investigation by the present inventors, of various conductor films configuring the back electrode BE, the nickel film E3 is most different in thermal expansion coefficient from the silicon substrate 1. Accordingly, as the manufacturing method of Embodiment 1, when heat treatment is performed in the processing apparatus SP during the formation of the back electrode BE, heat treatment after the deposition of the first metal film M1 but prior to the deposition of the nickel film E3 produces a sufficient effect.

On the other hand, the thermal expansion coefficient is different between another conductor film (barrier conductor film E2 or antioxidant conductor film E4) and the silicon substrate 1. It is therefore preferred to carry out heat treatment for forming the metal silicide film E1 as a first-level layer of the back electrode BE after deposition of the first metal film M1 over the backside surface f2 of the silicon substrate 1 but prior to the deposition of the barrier conductor film E2 which is the second-level layer. This enables to reduce the action of the stress to the silicon substrate 1 due to a difference in thermal expansion coefficient between the barrier conductor film E2 or the like and the silicon substrate. This means that an amount of warpage of the silicon substrate 1 due to heat treatment can be reduced further. As a result, reliability of a semiconductor device having a back electrode can be improved.

The above description on the manufacturing method of Embodiment 1 includes that on the step of depositing the barrier conductor film E2 between the metal silicide film E1 and the nickel film E3. The barrier conductor film E2 made of titanium or tungsten is not an essential element configuring the back electrode BE and the configuration of the back electrode BE is not limited to the configuration of the back electrode BE employing the barrier conductor film E2. In the manufacturing method of Embodiment 1, however, formation of the back electrode BE employing the barrier conductor film E2 as described above referring to FIG. 10 is preferred, because such a barrier conductor film E2 can block easily diffusible metal atoms such as gold atoms. In the manufacturing method of Embodiment 1, the antioxidant conductor film E4 which is the uppermost layer of the back electrode BE is made of gold so that penetration of gold atoms into the silicon substrate 1 can be prevented. Accordingly, the silicon substrate 1 can have a stable structure which does not easily undergo a change in electrical properties. As a result, reliability of a semiconductor device having a back electrode can be improved.

The above description of the manufacturing method of Embodiment 1 includes that of a method of forming, as the first metal film M1, a metal film having nickel or gold as a principal component and heat treating it to form, as the metal silicide film E1, a conductor film having nickel silicide or gold silicide as a principal component. As described above, the metal silicide film E1 is formed with a view to improving the adhesion between the back electrode BE and the silicon substrate 1 and reducing the contact resistance therebetween. From this viewpoint, use of the above material is preferred.

Moreover, in the manufacturing process of Embodiment 1, it is more preferred to form, as the first metal film M1, a metal film having nickel as a principal component and then heat treating it to form, as the metal silicide film E1, a conductor film having nickel silicide as a principal component. Nickel is preferred because as described above, gold atoms are easily diffusible and may become a pollutant changing the electrical properties of the silicon substrate 1. Use of nickel enables to reduce the possibility of introducing a pollutant. As a result, reliability of a semiconductor device having a back electrode can be improved.

The method of supporting the silicon substrate 1 in the susceptor sc to transfer the silicon substrate 1 with the robot arm cr in the processing apparatus SP of Embodiment 1 was described above. No limitation is imposed on the material of the susceptor sc insofar as it can support the silicon substrate 1 as described above referring to FIGS. 5 to 7.

In the processing apparatus SP of Embodiment 1, the susceptor sc is more preferably made of quartz (such as quartz glass). This means that in the manufacturing method of Embodiment 1, it is more preferred to carry out each step while supporting the silicon substrate 1 in the susceptor sc made of quartz when the back electrode BE is formed using the processing apparatus SP. The susceptor sc made of quartz has a small heat capacitance compared with a susceptor sc made of, for example, a metal (such as stainless steel (SUS)) so that it does not easily release heat from the silicon substrate 1. Use of the susceptor sc made of quartz therefore enables to prevent a temperature reduction at the outer periphery portion of the silicon substrate 1 to be brought into contact with the susceptor sc during the heat treatment step for forming the metal silicide film E1 as described above referring to FIG. 9. As a result, it can improve the in-plane uniformity of a temperature rise of the silicon substrate 1 during heat treatment. In particular, it can suppress a silicidation trouble due to a temperature reduction at the outer periphery portion in the step of forming the metal silicide film E1. As a result, reliability of a semiconductor device having a back electrode can be improved.

The above advantage is available by the use of a susceptor sc made of quartz at least in the step of carrying out heat treatment for forming the metal silicide film E1. If there is no necessity of changing the susceptor sc in the processing apparatus SP (or there is no such mechanism), the susceptor sc made of quartz may be used in all the steps performed in the processing apparatus.

In addition, the above description is of the configuration of the first chamber ch1 of Embodiment 1 equipped with the lamp heater LH for heating the silicon substrate 1 and also the thermo-equalizing plate HE, and the semi-transparent plate HT. The processing apparatus sp of Embodiment 1 is effective when the first chamber has therein both a mechanism of depositing the first metal film M1 over the silicon substrate 1 and a mechanism of forming the metal silicide film E1 by heating the silicon substrate 1. Neither the thermo-equalizing plate HE nor the semi-transparent plate HT is an essential component as a constituent of the processing apparatus SP producing the above effect.

The processing apparatus SP of Embodiment 1 is preferably equipped with, in the first chamber ch1, the thermo-equalizing plate HE and the semi-transparent plate HT as described above referring to FIG. 9, because as described above, the thermo-equalizing plate HE can relax a temperature rise at the center portion of the silicon substrate 1. In addition, the semi-transparent plate HT prevents direct exposure of the silicon substrate 1 to radiation heat from a lamp heater and facilitates temperature control. Thus, the uniformity of the in-plane temperature of the silicon substrate 1 can be improved further during the heat treatment of the silicon substrate 1. A partial silicidation trouble therefore does not occur easily in the step of forming the metal silicide film E1. As a result, reliability of a semiconductor device having a back electrode can be improved.

The above description of the manufacturing method of Embodiment 1 includes that of the step of forming the back electrode BE after grinding and polishing the backside surface of the silicon substrate 1. This method is however also effective when applied to a step of forming the back electrode BE without grinding and polishing the backside surface f2 of the silicon substrate 1. As the silicon substrate 1 is thinner, the amount of warpage due to stress becomes greater. Since the warpage of the silicon substrate 1 can be suppressed in the manufacturing method of Embodiment 1, the method is more effective when applied to the case where the silicon substrate 1 should be thinned by grinding and polishing the backside surface f2 of the silicon substrate 1.

Further, according to the above description of the manufacturing method of Embodiment 1, the first metal film M1 which has remained unalloyed in the step of alloying the first metal film M1 and the backside surface f2 of the silicon substrate 1 to form the metal silicide film E1 is not removed. Such an unnecessary portion of the first metal film M1 may be removed, but is preferably not removed, because the back electrode having a multilayer structure can be formed without taking the silicon substrate 1 out of the processing apparatus SP. This makes it possible to form the back electrode without forming a high resistance oxide film on the interface between the constituent layers of the back electrode having a multilayer structure. As a result, reliability of a semiconductor device having a back electrode can be improved.

In the alloying step of the first metal film M1 and the backside surface f2 in the manufacturing method of Embodiment 1, it is more preferred to carry out heat treatment so as to alloy a whole portion of the first metal film M1 into the metal silicide film E1. According to the above description of the manufacturing method of Embodiment 1, the first metal film M1 which has remained unalloyed may be left without removal. When the whole portion of the first metal film M1 is alloyed, the first metal film M1 having high resistance can be alloyed into a metal silicide film E1 having lower resistance (resistivity) than that of the first metal film M1. This enables to reduce the resistance of the back electrode BE further. As a result, reliability of a semiconductor device having a back electrode can be improved.

According to the above description of the manufacturing method of Embodiment 1, the nickel film E3 is deposited to give a film thickness of from 200 to 400 nm. As described above, the nickel film E3 is formed to improve the adhesion with the solder SD. From this standpoint, the thickness of the nickel film E3 is not limited to the above range. In the manufacturing method of Embodiment 1, however, the nickel film E3 is preferably deposited to give the above film thickness, because the nickel film E3 is preferably thinner from the viewpoint of the stress imposed thereby on the silicon substrate 1. In addition, since the nickel film E3 is adhered after alloyed with the solder SD in which the gold atoms of the antioxidant conductor film E4 have been melted, the nickel film E3 is required to have an adequate thickness in order to reduce the influence of diffused gold atoms. From these viewpoints, the nickel film E3 is more preferably deposited to a thickness of from 200 to 400 nm. As a result, reliability of a semiconductor device having a back electrode can be improved.

(Embodiment 2) According to the above description of the manufacturing method of Embodiment 1, heat treatment for forming the metal silicide film E1 is performed prior to the deposition of the nickel film E3, which imposes the greatest stress on the silicon substrate 1 by the heat treatment, to reduce the stress to the silicon substrate 1. The further investigation by the present inventors has revealed that even during the deposition step of the nickel film E3 itself, radiation heat increases the temperature of the silicon substrate 1 and the silicon substrate 1 is heated. Also by this heat, the nickel film E3 can impose a stress on the silicon substrate 1. In this Embodiment 2, a method of reducing the influence of heat which is emitted during formation of the nickel film E3 and the configuration of a manufacturing apparatus necessary for actualizing it will be described.

Embodiment 2 relates to a deposition method of the nickel film E3 over the backside surface f2 of the silicon substrate 1 described above referring to FIG. 10 in the manufacturing method of a semiconductor device according to Embodiment 1. Embodiment 2 is similar to Embodiment 1 except for the deposition step of the nickel film E3 and the configuration of a manufacturing apparatus used therefor. In other words, the steps prior to the deposition of the nickel film E3 over the backside surface f2 of the silicon substrate 1 and steps subsequent to the deposition step, and the configuration of the manufacturing apparatus used therefor are similar to those in Embodiment 1. Overlapping description is omitted. Effects and advantages offered by similar manufacturing method and manufacturing apparatus are also as described above in Embodiment 1 so that overlapping description is omitted.

As described above, the nickel film E3 is deposited over the backside surface f2 of the silicon substrate 1 by sputtering in a third chamber ch. The third chamber ch3 of Embodiment 2 has the following configuration.

Figure 12:
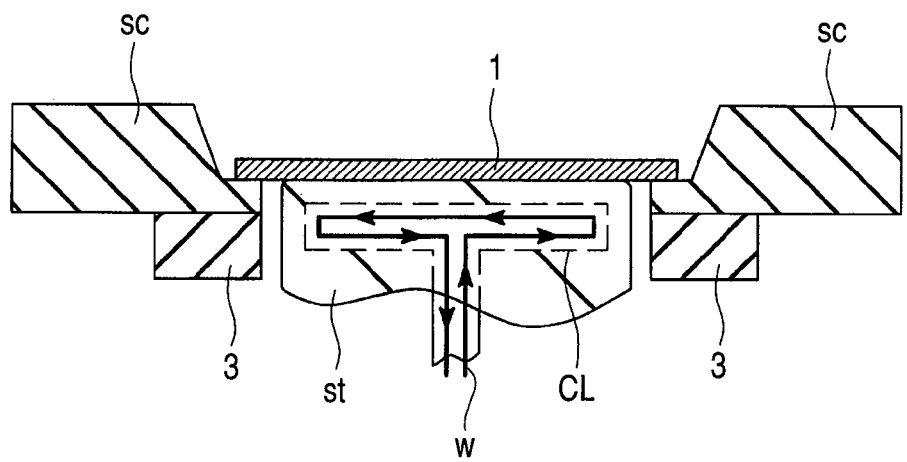
FIG. 12 is a fragmentary cross-sectional view during a manufacturing step of a semiconductor device by using a semiconductor manufacturing apparatus according to Embodiment 2 of the invention.

As illustrated in FIG. 12, the third chamber ch3 of Embodiment 2 has a substrate pedestal st for placing thereon the silicon substrate 1 supported by the susceptor sc. The substrate pedestal st has a cooling mechanism CL. The cooling mechanism CL has a mechanism of circulating cooling water w inside the substrate pedestal st and therefore has a function of cooling the substrate pedestal st. Thus, the third chamber ch3 of Embodiment 2 has the substrate pedestal st having the cooling mechanism CL so that it has a function of cooling the silicon substrate 1 while depositing the nickel film E3 over the silicon substrate 1.

According to the manufacturing method of Embodiment 2, in the step s06 of FIG. 1, the silicon substrate 1 is placed on the substrate pedestal st having the cooling mechanism CL and disposed in the third chamber ch3 and the nickel film E3 is deposited by sputtering while cooling the silicon substrate 1. This enables to relax a temperature rise of the silicon substrate 1 at the time of depositing the nickel film E3 thereon and it enables to relax the stress to the silicon substrate 1 applied from the nickel film E3 upon heat treatment. This leads to reduction of the warpage of the silicon substrate 1 which occurs at the time of formation of the back electrode BE. As a result, cracks or damage of the silicon substrate 1 during manufacturing steps or unsatisfactory mounting of a chip or generation of package cracks can be reduced further. As a result, reliability of a semiconductor device having a back electrode can be improved.

The substrate pedestal st disposed in the third chamber ch3 of Embodiment 2 has preferably an electrostatic adsorption mechanism. The electrostatic adsorption mechanism has an adsorbing function, that is, so-called electrostatic chuck (ESC) function of adsorbing the silicon substrate through an electrostatic force during deposition of the nickel film E3 over the silicon substrate 1. This means that at least the surface of the substrate pedestal st to be brought into contact with the silicon substrate 1 while having the silicon substrate 1 thereon has an electrically energizable mechanism by which the substrate can be charged. Through this mechanism, the substrate pedestal adsorbs the silicon substrate 1 thereto. By employing such a mechanism, the substrate pedestal st having the cooling mechanism CL and the silicon substrate 1 can be adhered more firmly and thereby a cooling efficiency can be increased. This makes it possible to relax a temperature rise of the silicon substrate 1 when the nickel film E3 is deposited thereover and the stress to the silicon substrate 1 applied from the nickel film E3 during heat treatment can be relaxed. As a result, reliability of a semiconductor device having a back electrode can be improved.

Figure 18:
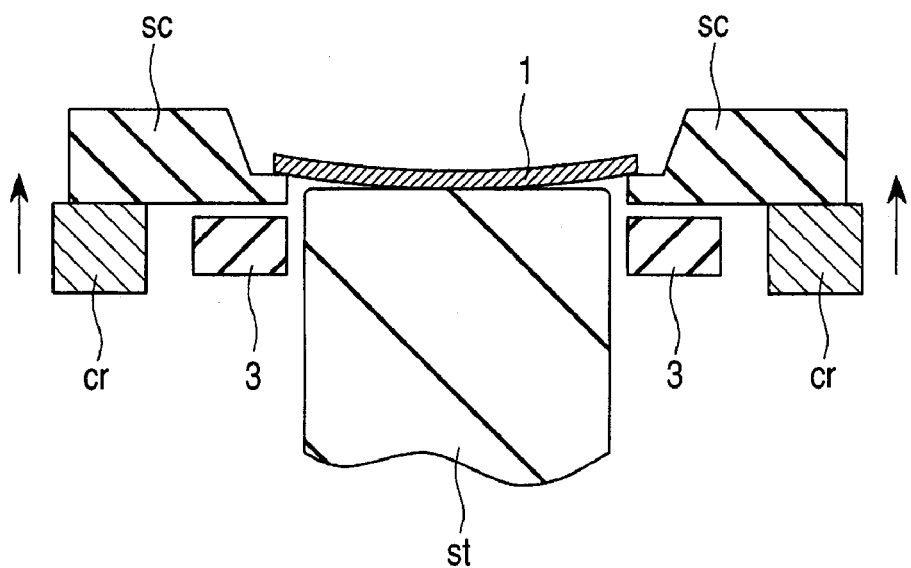
FIG. 18 is a fragmentary cross-sectional view during a manufacturing step of a semiconductor device by using a semiconductor manufacturing equipment investigated by the present inventors.

Further investigation by the present inventors has revealed that a phenomenon as will be described below referring to FIG. 18 occurs. When a thin film is deposited over a substrate by sputtering, the substrate is usually charged with electricity. Such charging of the silicon substrate 1 does not pose any serious problem if the silicon substrate 1 is brought into contact with only the outer peripheral portion of the susceptor sc and the susceptor sc having the silicon substrate 1 mounted thereon is transported using the robot arm cr.

In the manufacturing method of Embodiment 2, on the other hand, the substrate pedestal st to be brought into contact with the silicon substrate 1 with a wide area is employed as described above referring to FIG. 12 in the step of depositing the nickel film E3. Even if the substrate pedestal st itself has an electrically neutralizing mechanism, electrostatic adhesion occurs between the silicon substrate 1 and the substrate pedestal st as illustrated in FIG. 18 unless the silicon substrate 1 is electrically neutralized. When the silicon substrate supported by the susceptor sc is transported by the method illustrated in FIG. 6 and 7 under such a state, the silicon substrate 1 sticks to the substrate pedestal st. This may cause scratches or cracks of the silicon substrate 1. Moreover, in the manufacturing method of Embodiment 2, use of the susceptor sc made of quartz makes neutralization more difficult.

The manufacturing method and manufacturing apparatus according to Embodiment 2 equipped with the cooling mechanism CL as described above are effective for relaxing the stress to the silicon substrate 1 during deposition of the nickel film E3. Moreover, addition of the following configuration to the susceptor sc enables to neutralize the silicon substrate 1 charged during the deposition step of the nickel film E3.

The configuration to be added will next be described referring to FIGS. 13 and 14. FIG. 14 is an enlarged view of the portion p100 of FIG. 13. The susceptor sc of Embodiment 2 has a neutralization body FE. The neutralization body FE is a member made of a conductor having, for example, aluminum or copper as a principal component and is disposed on the susceptor sc at a position satisfying the following conditions.

First, the neutralization body FE is placed at a position, on the susceptor sc, to be covered integrally with the silicon substrate 1 when the nickel film E3 is deposited over the backside surface f2 of the silicon substrate 1 in the third chamber ch3. For example, the neutralization body FE is placed on the surface of the susceptor sc facing in the same direction as the backside surface f2 of the silicon substrate 1 on which the nickel film E3 is deposited while having the silicon substrate 1 placed on the susceptor sc. When the nickel film E3 is deposited by sputtering in the third chamber ch3 with the neutralization body FE being placed as described above, both the silicon substrate 1 and the neutralization body FE are covered together with the nickel film E. This means that the silicon substrate 1 and the neutralization body FE are electrically coupled via the nickel film E3 by the deposition of the nickel film E3.

Secondly, the neutralization body FE is placed at a position, on the susceptor sc, to be brought into contact with the robot arm cr for transporting the susceptor sc having thereon the silicon substrate 1. Referring to FIGS. 6 and 7, the transport mechanism, via the robot arm cr, of the silicon substrate 1 supported by the susceptor sc is described above. According to the description, the robot arm cr lifts up the susceptor sc to separate it from the susceptor pedestal 3, followed by transport of the silicon substrate. The neutralization body FE of Embodiment 2 is therefore placed at a position of the susceptor sc with which the robot arm cr can be brought into contact when it lifts up the susceptor sc.

Thirdly, the neutralization body FE is placed so as to couple, into one body, the neutralization bodies FE at positions on the susceptor sc as described above in the first and second conditions. Since the neutralization body FE is arranged on the susceptor sc as described above, the silicon substrate 1 and the neutralization body FE are electrically coupled via the nickel film E3 when the nickel film E3 is deposited over the backside surface f2 of the silicon substrate 1.

The neutralization body FE of Embodiment 2, as one example, in an integral clip form capable of fitting therein the susceptor sc from the upper surface (on the side of the backside surface f2 of the silicon substrate 1) of the susceptor sc to the lower surface (position to be lifted up by the robot arm cr) of the susceptor sc satisfies the above conditions.

Next, the neutralization mechanism of the silicon substrate 1, which has been charged in the deposition step of the nickel film E3, by using the susceptor sc equipped with the neutralization body as described above will be described. The step is of transporting, via the robot arm cr, the silicon substrate 1 supported by the susceptor sc after completion of the deposition of the nickel film E3 over the backside surface f2 of the silicon substrate 1 in the third chamber ch3.

Figure 15:
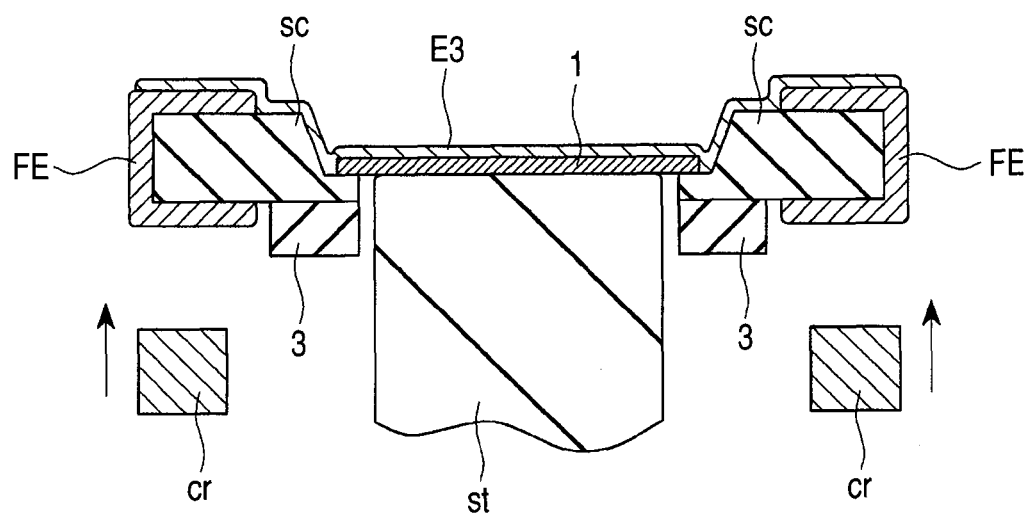
FIG. 15 is a fragmentary cross-sectional view during a manufacturing step of the semiconductor device subsequent to that of FIG. 13.
Figure 16:
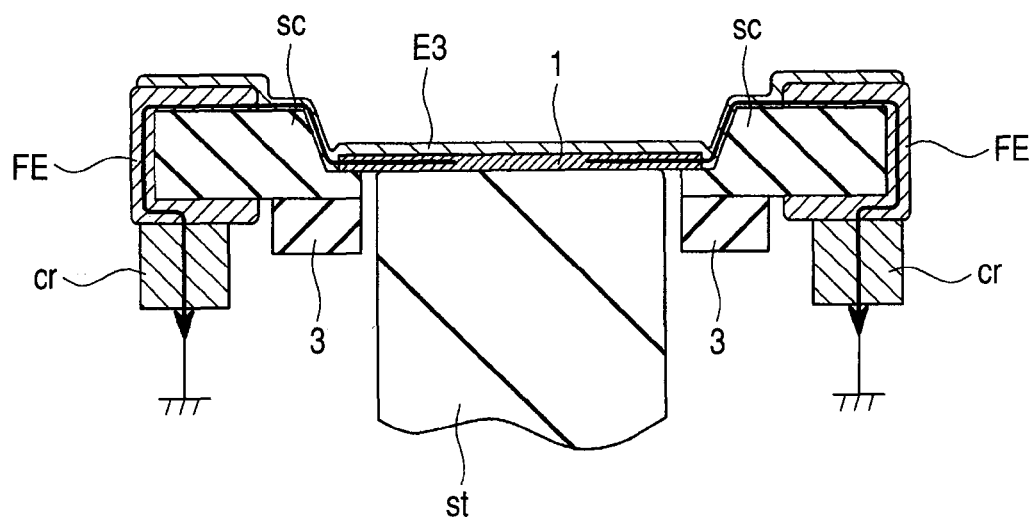
FIG. 16 is a fragmentary cross-sectional view during a manufacturing step of the semiconductor device subsequent to that of FIG. 15.

As illustrated in FIG. 15, the silicon substrate 1 supported by the susceptor sc is separated from the susceptor pedestal 3 and the substrate pedestal st, and the robot arm cr ascends from the lower portion of the susceptor sc. As illustrated in FIG. 16, the robot arm cr comes into contact with the susceptor sc and lifts up the susceptor sc.

The susceptor sc of Embodiment 2 has the neutralization body FE at a position with which the robot arm cr can be brought into contact. The robot arm cr therefore comes into contact with the neutralization body FE on the susceptor sc and lifts up the susceptor sc.

Figure 13:
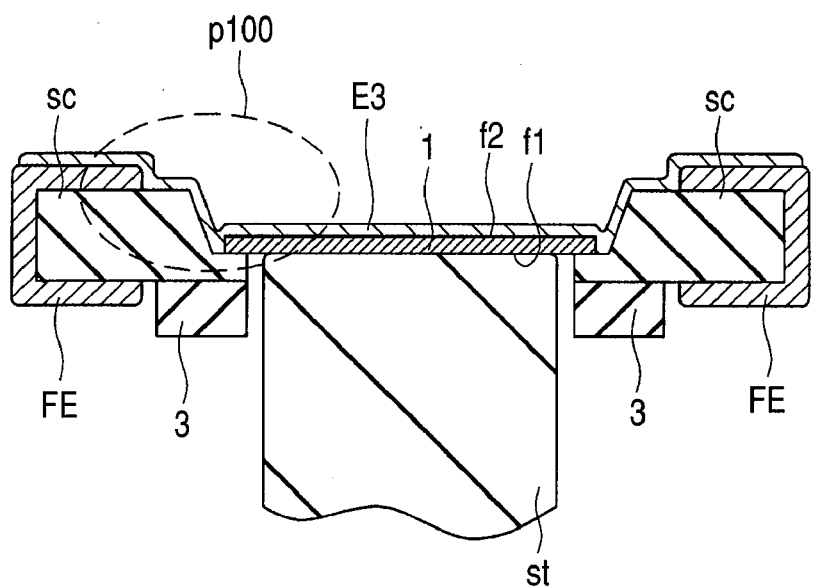
FIG. 13 is a fragmentary cross-sectional view during a manufacturing step, subsequent to that of FIG. 12, of the semiconductor device by using the semiconductor manufacturing apparatus according to Embodiment 2 of the invention.
Figure 14:
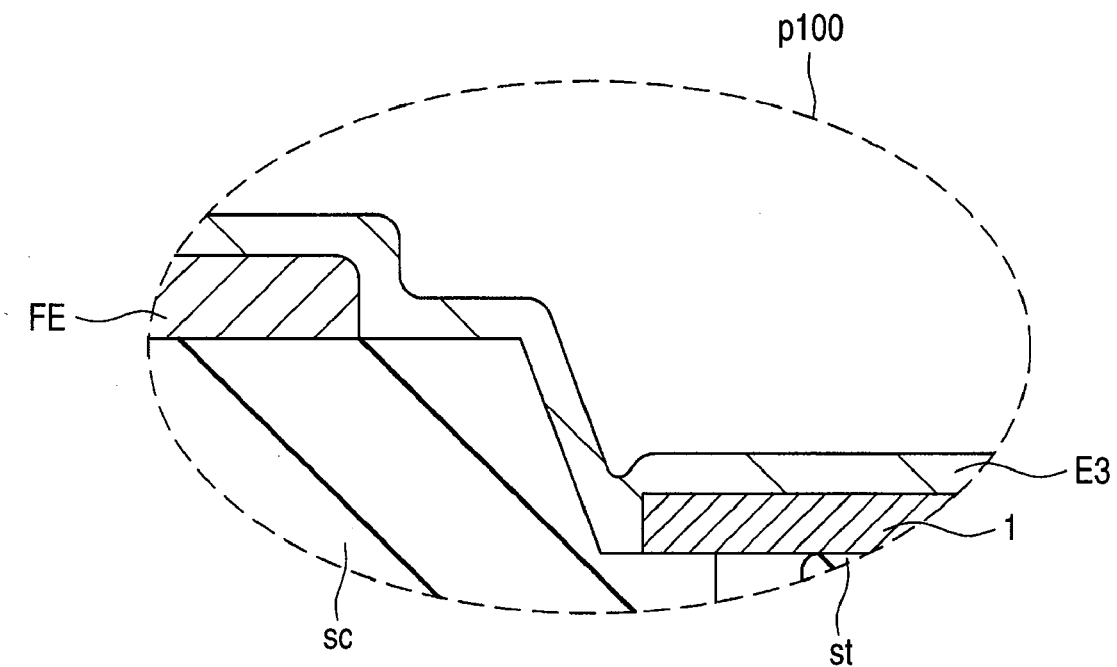
FIG. 14 is an enlarged fragmentary cross-sectional view of the portion shown in FIG. 13.
Figure 17:
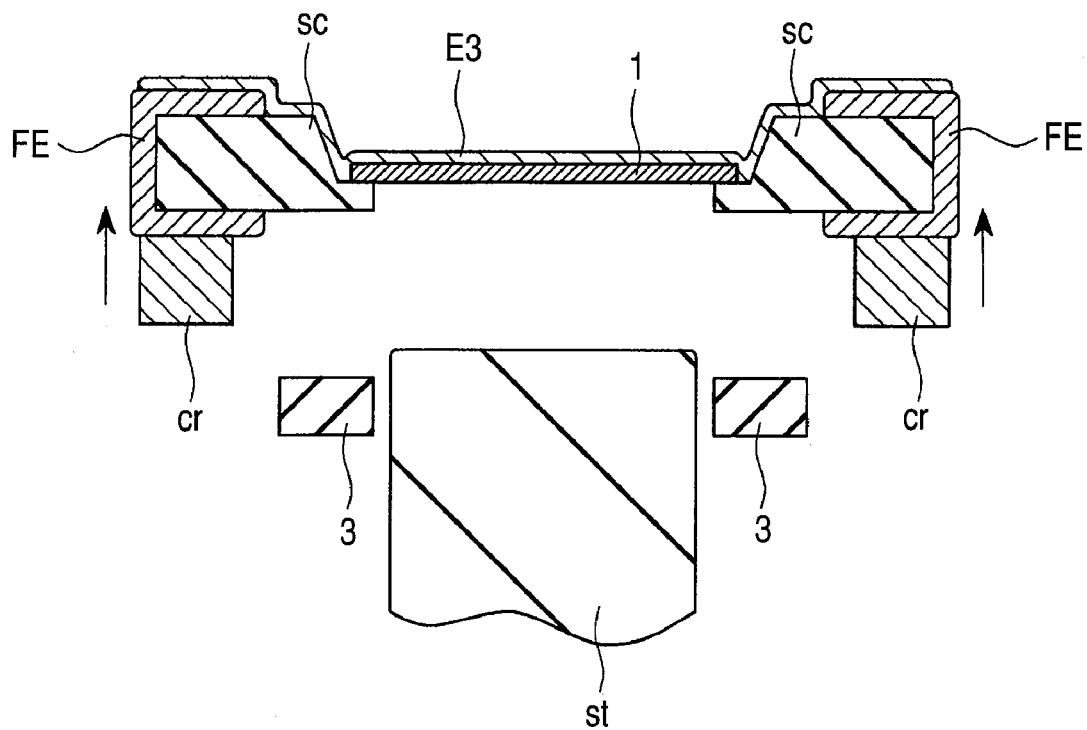
FIG. 17 is a fragmentary cross-sectional view during a manufacturing step of the semiconductor device subsequent to that of FIG. 16.

As illustrated in FIGS. 13 and 14, the neutralization body FE is electrically coupled to the silicon substrate 1 via the nickel film E3 deposited in the third chamber ch3 so that when the robot arm cr is brought into contact with the neutralization body FE in order to lift up the susceptor sc, the silicon substrate 1 and the robot arm cr are electrically coupled and in a conduction mode via the neutralization body FE and the nickel film E3. When the robot arm cr is, for example, at a ground (earth) potential, the charged silicon substrate 1 is neutralized via the robot arm cr. As illustrated in FIG. 17, accordingly, even if the robot arm cr lifts up the susceptor sc, the silicon substrate 1 not charged as described above does not stick to the substrate pedestal st and can be separated therefrom.

In the manufacturing method and manufacturing apparatus of Embodiment 2 each having the configuration as described above, the silicon substrate 1 charged during the deposition of the nickel film E3 can be neutralized at the time of the transport and therefore does not stick to the substrate pedestal st so that it can be transported independently. The above method using the neutralization body FE is also effective when the susceptor sc is made of quartz to improve the temperature uniformity of the silicon substrate 1, which is an important factor in the other heat treatment steps. Even if the silicon pedestal st equipped with the cooling mechanism CL effective for relaxing the stress acting on the silicon substrate 1 is used upon deposition of the nickel film E3 thereover, cracks and damage of the silicon substrate 1 due to charging of the silicon substrate 1 can be avoided. This means that it is possible to relax the stress action of the nickel film E3 to the silicon substrate 1 without a concern for the damage of the silicon substrate 1 which may occur during transport. This makes it possible to reduce the warpage which may occur in the silicon substrate 1 during the steps without a concern for the damage of the silicon substrate 1. As a result, reliability of a semiconductor device having a back electrode can be improved.

In the semiconductor manufacturing apparatus of Embodiment 1 or Embodiment 2 having the processing apparatus SP, the first chamber ch1 and the third chamber ch3 of the chambers CH have characteristic configurations, respectively. Described specifically, the first chamber ch1 has a sputtering mechanism for depositing the first metal film M1 over the silicon substrate 1 and a mechanism of heat treating the silicon substrate 1. The third chamber ch3, on the other hand, has the substrate pedestal st having a mechanism of cooling the silicon substrate 1 and an electrostatic adsorption mechanism.

The barrier conductor film E2 and the antioxidant conductor film E4, on the other hand, are deposited over the silicon substrate 1 by using typical sputtering. As described in the manufacturing method of Embodiment 1 or Embodiment 2, the deposition steps of the barrier conductor film E2 and the antioxidant conductor film E4 are preferably performed in the same second chamber ch2, because common use of this processing chamber enables size reduction and simplification of the processing apparatus SP itself and realizes highly efficient maintenance and cost reduction. As a result, the quality of the manufacturing steps of the semiconductor device can be improved and reliability of the semiconductor device having a back electrode can be improved further.

In the manufacturing method and manufacturing apparatus according to Embodiment 2, the substrate pedestal st equipped with the cooling mechanism CL and the electrostatic adsorption mechanism is placed in the third chamber ch3 for depositing the nickel film E3 in order to dispel the concern that the nickel film E3 imposes a particularly large stress to the silicon substrate 1. On the other hand, there is a difference in thermal expansion coefficient between the silicon substrate 1 and the barrier conductor film E2 or the antioxidant conductor film E4 configuring the back electrode BE. When the warpage of the silicon substrate 1 due to the stress of such a film is marked, the second chamber ch2 may be equipped with a substrate pedestal st having a similar configuration. This makes it possible to further reduce the warpage of the silicon substrate 1 which may occur during the formation step of the back electrode BE. As a result, the reliability of the semiconductor device having an end electrode can be improved.

The inventions made by the present inventors were described specifically based on embodiments. It should however be borne in mind that the invention is not limited to or by these embodiments and can be changed without departing from the gist of the invention.

The invention can be used effectively in the semiconductor industry relating to information processors, for example, personal computers and mobile devices.

What is claimed is:

1. A manufacturing method of a semiconductor device, comprising the steps of:
   (a) forming a semiconductor element over a first main surface of a semiconductor substrate having the first main surface and a second main surface opposite to each other along a thickness direction;
   (b) depositing a first metal film over the second main surface of the semiconductor substrate;
   (c) carrying out heat treatment to alloy the interface between the first metal film and the semiconductor substrate and thereby form a first conductor film;
   (d) depositing a second conductor film to cover the first conductor film therewith; and
   (e) depositing a third conductor film to cover the second conductor film therewith,
   wherein in the step (d), the second conductor film is deposited using a conductor film having nickel as a principal component,
   wherein in the step (e), the third conductor film is deposited using a conductor film having gold as a principal component,
   wherein the step (c) is performed after the step (b) but at least prior to the step (d), and
   wherein the steps (b) to (e) are performed in the same processing apparatus in order to prevent exposure of the semiconductor substrate to the atmosphere during the steps,
   wherein in the step (b), a first metal film is deposited using a metal film having nickel as a principal component,
   wherein in the step (c), the heat treatment is carried out while supporting the semiconductor substrate with a support containing quartz,
   further including, after the step (b) but prior to the step (d), a step of:
   (f) depositing a fourth conductor film over the second main surface of the semiconductor substrate,
   wherein in the step (d), the second conductor film is deposited over the fourth conductor film, and
   wherein in the step (f), the fourth conductor film is deposited using a conductor film having titanium or tungsten or a compound thereof as a principal component,
   wherein the step (c) is performed after the step (b) but prior to the step (f), and
   wherein in the step (f), the fourth conductor film is deposited so as to cover the first conductor film over the second main surface of the semiconductor substrate,
   further including, after the step (a) prior to the step (b), a step of:
   (g) grinding the second main surface of the semiconductor substrate to thin the semiconductor substrate, and
   wherein in the step (d), the second conductor film is deposited while cooling the semiconductor substrate.

2. The manufacturing method of a semiconductor device according to claim 1, wherein in the step (d), the second conductor film is deposited to give a thickness of from 200 to 400 nm.

3. The manufacturing method of a semiconductor device according to claim 2, wherein both the step (e) and the step (f) are performed in a second processing chamber placed in the processing apparatus.

* * * * *